US012230360B2

(12) United States Patent
Wang et al.

(10) Patent No.: US 12,230,360 B2
(45) Date of Patent: Feb. 18, 2025

(54) CONTROLLING MEMORY MODULE CLOCK BUFFER POWER IN A SYSTEM WITH DUAL MEMORY CLOCKS PER MEMORY MODULE

(71) Applicant: DELL PRODUCTS L.P., Round Rock, TX (US)

(72) Inventors: Isaac Q. Wang, Austin, TX (US); Lee B. Zaretsky, Nazare (PT)

(73) Assignee: Dell Products L.P., Round Rock, TX (US)

( * ) Notice: Subject to any disclaimer, the term of this patent is extended or adjusted under 35 U.S.C. 154(b) by 93 days.

(21) Appl. No.: 18/176,284

(22) Filed: Feb. 28, 2023

(65) Prior Publication Data

US 2024/0119980 A1    Apr. 11, 2024

Related U.S. Application Data

(63) Continuation-in-part of application No. 17/962,387, filed on Oct. 7, 2022.

(51) Int. Cl.
*G11C 7/22* (2006.01)
*G11C 7/10* (2006.01)

(52) U.S. Cl.
CPC .......... *G11C 7/222* (2013.01); *G11C 7/1057* (2013.01); *G11C 7/225* (2013.01)

(58) Field of Classification Search
CPC ........ G11C 7/222; G11C 7/1057; G11C 7/225
See application file for complete search history.

(56) References Cited

U.S. PATENT DOCUMENTS

| 7,522,469 | B2 | 4/2009 | Lee | |
|---|---|---|---|---|
| 8,824,235 | B2 | 9/2014 | Balluchi et al. | |
| 11,380,378 | B1* | 7/2022 | Jiang | G11C 7/222 |
| 2002/0062457 | A1* | 5/2002 | Kamihara | H03L 7/0995 |
| | | | | 713/600 |
| 2006/0259678 | A1* | 11/2006 | Gervasi | G11C 5/00 |
| | | | | 711/2 |
| 2010/0042778 | A1* | 2/2010 | Tanguay | G11C 7/1045 |
| | | | | 711/E12.083 |
| 2020/0073562 | A1* | 3/2020 | Kim | G06F 12/0238 |
| 2021/0026649 | A1* | 1/2021 | Kotary | G06F 13/1668 |
| 2023/0420016 | A1* | 12/2023 | Jiang | G11C 7/1012 |

OTHER PUBLICATIONS

Ha, Kyung-Soo, et al. "A 7.5 GB/s/pin 8-Gb LPDDR5 SDRAM with various high-speed and low-power techniques." IEEE Journal of Solid-State Circuits 55.1 (2019): 157-166. (Year: 2019).*
Kaviani, Kambiz, et al. "A tri-modal 20-Gbps/link differential/DDR3/GDDR5 memory interface." IEEE journal of solid-state circuits 47.4 (2012): 926-937. (Year: 2012).*

* cited by examiner

*Primary Examiner* — Nicholas J Simonetti
(74) *Attorney, Agent, or Firm* — Larson Newman, LLP

(57) ABSTRACT

A clock buffer device for a memory module includes a first clock input coupled to an input of a first phase-locked loop (PLL), and a second clock input coupled to an input of a second PLL. An output of the first PLL is selectably coupled to clock output buffers, and an output of the second PLL is selectably coupled to a subset of the clock output buffers. The clock buffer device receives a first indication that a first information handling system is configured to provide a first clock signal on the first clock input but to not provide a second clock signal on the second clock input, and, in response to the indication, couples the output of the first PLL to the clock output buffers and to disables the second PLL.

20 Claims, 5 Drawing Sheets

CONTROLLING MEMORY MODULE CLOCK BUFFER POWER IN A SYSTEM WITH DUAL MEMORY CLOCKS PER MEMORY MODULE

CROSS-REFERENCE TO RELATED APPLICATION

This application is a Continuation-in-part of U.S. patent application Ser. No. 17/962,387 entitled "METHOD FOR POWER REDUCTION IN MEMORY MODULES," filed Oct. 7, 2022, the disclosure of which is hereby expressly incorporated by reference in its entirety.

Related subject matter is contained in co-pending U.S. patent application Ser. No. 18/176,096 (DC-131514) entitled "POWER REDUCTION IN A CLOCK BUFFER OF A MEMORY MODULE BASED UPON MEMORY MODULE TOPOLOGY," filed of even Feb. 28, 2023, the disclosure of which is hereby incorporated by reference.

Related subject matter is contained in co-pending U.S. patent application Ser. No. 18/176,121 (DC-131515) entitled "POWER REDUCTION IN A CLOCK BUFFER OF A MEMORY MODULE BASED UPON MEMORY MODULE SPEED," filed Feb. 28, 2023, the disclosure of which is hereby incorporated by reference.

Related subject matter is contained in co-pending U.S. patent application Ser. No. 18/176,268 (DC-131516) entitled "CONTROLLING MEMORY MODULE CLOCK BUFFER POWER IN A SYSTEM WITH A SINGLE MEMORY CLOCK PER MEMORY MODULE," filed Feb. 28, 2023, the disclosure of which is hereby incorporated by reference.

FIELD OF THE DISCLOSURE

This disclosure generally relates to information handling systems, and more particularly relates to controlling power reduction in a clock buffer of a memory module by an information handling system with dual memory clocks per memory module.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A clock buffer device for a memory module may include a first clock input coupled to an input of a first phase-locked loop (PLL), and a second clock input coupled to an input of a second PLL. An output of the first PLL may be selectably coupled to clock output buffers, and an output of the second PLL may be selectably coupled to a subset of the clock output buffers. The clock buffer device may receive a first indication that a first information handling system is configured to provide a first clock signal on the first clock input but to not provide a second clock signal on the second clock input, and, in response to the indication, may couple the output of the first PLL to the clock output buffers and may disable the second PLL.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
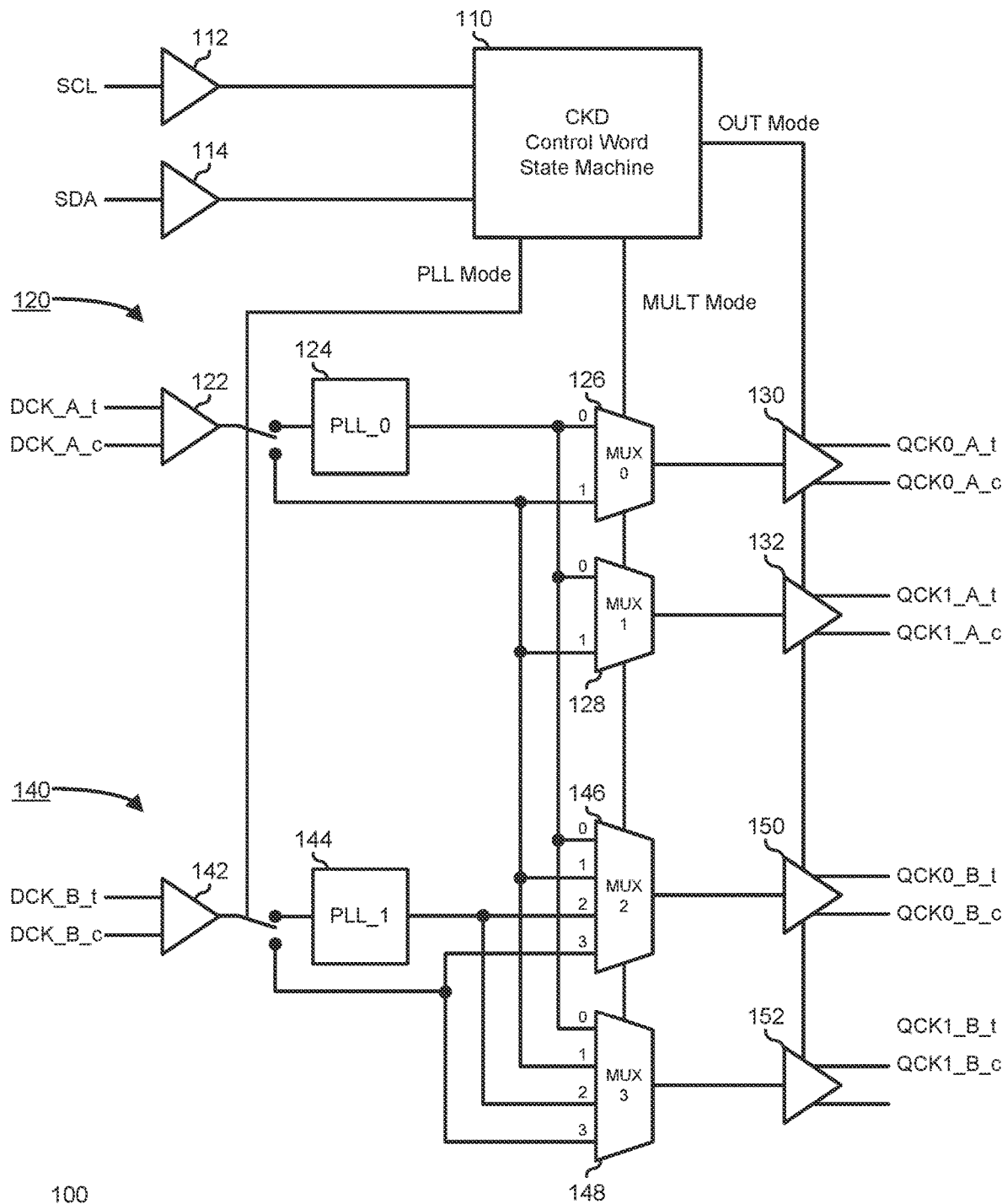
FIG. 1 is a block diagram of a clock buffer according to an embodiment of the current disclosure.

FIG. 1 illustrates a clock buffer 100 for inclusion on double data rate (DDR) memory modules, such as on fifth generation DDR (DDR5) and sixth generation DDR (DDR6) memory modules. In a particular embodiment, clock buffer 100 represents a discrete integrated circuit device assembled onto a memory module, such as a dual in-line memory module (DIMM), an unregisterd DIMM (UDIMM), a small outline DIMM (SoDIMM), a compression attached memory module (CAMM), or another memory module form factor, as needed or desired. In another embodiment, the functions and features of clock buffer 100 are integrated with another device assembled onto a memory module, such as a registering clock driver (RCD) integrated circuit, or the like.

Clock buffer 100 includes a clock state machine 110 that receives a two-wire input including a serial clock (SCL)

input 112 and a serial data (SDA) input 114. Clock state machine 110 may represent an inter-integrated circuit (I2C) interface based, or other two-wire input device configured to receive configuration inputs and to provide control signal outputs as described below, as needed or desired. Clock state machine 110 operates to receive input data and to convert the input data into various outputs that control the operations of the other devices of clock buffer 100, as described below. Clock state machine 110 may be instantiated in circuitry of clock buffer 100, as code or microcode programmed into the clock buffer, or in any other form suitable to providing the functions and features of the clock state machine as described herein. The details of two-wire interfaces are known in the art and will not be further described herein, except as may be needed to illustrate the current embodiments.

Clock buffer 100 further includes clock trees 120 and 140. Clock tree 120 includes a clock input buffer 122, a phase-locked loop (PLL) 124, a pair of multiplexors 126 (MUX 0) and 128 (MUX 1), and a pair of clock output buffers 130 and 132. Clock tree 140 includes a clock input buffer 142, a PLL 144, a pair of multiplexors 146 (MUX 2) and 148 (MUX 3), and a pair of clock output buffers 150 and 152.

A first differential signal pair clock input (DCK_A_t/c) associated with a first sub-channel (sub-channel A) of the split channel topology of DDR5 is connected to inputs of input clock buffer 122. An output of input clock buffer 122 is connected via a first switched contact to an input of PLL 124, and an output of the PLL is connected to first inputs of multiplexors 126, 128, 146, and 148. The output of input clock buffer 122 is further connected via a second switch contact to second inputs of multiplexors 126, 128, 146, and 148. A second differential signal pair clock input (DCK_B_t/c) associated with a second sub-channel (sub-channel B) of the split channel topology of DDR5 is connected to inputs of input clock buffer 142. An output of input clock buffer 142 is connected via a first switch contact to an input of PLL 144, and an output of the PLL is connected to third inputs of multiplexors 146, and 148. The output of input clock buffer 142 is further connected via a second switch contact to fourth inputs of multiplexors 146 and 148.

A PLL Mode output of clock state machine 110 selects to switch the output of input clock buffer 122 between the first switch contact to PLL 124 and the second switch contact to the second inputs of multiplexors 126, 128, 146, and 148. The PLL Mode output of clock state machine 110 further selects to switch the output of input clock buffer 142 between the first switch contact to PLL 144 and the fourth inputs of multiplexors 146 and 148.

An output of multiplexor 126 is connected to an input of clock output buffer 130, an output of multiplexor 128 is connected to an input of clock output buffer 132, an output of multiplexor 146 is connected to an input of clock output buffer 150, and an output of multiplexor 148 is connected to an input of clock output buffer 152. A differential signal pair clock output (QCK0_A_t/c) of output clock buffer 130 is provided to clock memory devices of a first rank (rank 0) of sub-channel A. A differential signal pair clock output (QCK1_A_t/c) of output clock buffer 132 is provided to clock memory devices of a second rank (rank 1) of sub-channel A. A differential signal pair clock output (QCK0_B_t/c) clock buffer 150 is provided to clock memory devices of a first rank (rank 0) of sub-channel B. A differential signal pair clock output (QCK1_B_t/c) of output clock buffer 152 is provided to clock memory devices of a second rank (rank 1) of sub-channel B.

A multiplexor mode output of clock state machine 110 is connected to control inputs of multiplexors 126, 128, 146, and 148. The multiplexor mode output operates to select one of the inputs of each of multiplexors 126, 128, 146, and 148 to connect to their associated output clock buffers 130, 132, 150, and 152. The multiplexor mode output may represent individual outputs to multiplexors 126, 128, 146, and 148, as needed or desired, such that each of the multiplexors may be controlled independently from the other multiplexors, as described below. Further one or more of multiplexors 126, 128, 146, and 148 may be operated in a tri-state mode, where the output of the particular multiplexors are not connected to any of their inputs, thereby providing no output signal to their associated output clock buffers 130, 132, 150, and 152, as needed or desired, as described further below. An output mode output of clock state machine 110 is provided to enable outputs of output clock buffers 130, 132, 150, and 152. The output mode operates to enable the individual output clock buffers 130, 132, 150, and 152 to provide their respective output clock signals.

Current DDR topologies, such as DDR5 topologies, may reach a transfer rate limit, such as a limit of 5600 megabits per second (Mbps) or 6000 Mbps, due to clock scaling challenges. In particular, as the system generated clock is provided from a circuit board of the information handling system to the individual memory devices on the memory module, effects such as additive jitter, clock skew, and margin constraints become increasingly difficult to manage at speeds of 5600 Mbps or higher. For this reason, the JEDEC standards body has specified the inclusion of a clock buffer device like clock buffer 100 to be included on memory modules to help mitigate the clock scaling challenges and to enable memory roadmaps beyond 5600 Mbps transfer rates.

The inclusion of PLLs 124 and 144 within clock buffer 100 operates to clean up the input clock signals from respective input clock buffers 122 and 142 to eliminate jitter, clock skew, and poor margins. However, the inclusion of clock buffer 100 within a memory module may be expected to significantly increase the power draw of the memory module. For example, a particular clock buffer may draw around 120 milliwatts (mW) of power. In battery operated information handling systems, such as laptop computers and the like, this may translate to a battery life reduction of up to 24 minutes per installed memory module. Also, in enterprise systems that utilize dozens of memory modules or more, this level of added power results in much greater thermal loads and the consequent reduction in processing performance of the enterprise information handling system. Thus, when the memory module is operating at transfer rates slower than 5600 Mbps, the PLL Mode output can be provided to connect the output of input clock buffers 122 and 142 directly to the inputs of multiplexors 126, 128, 146, and 148, as described above, in what will be referred to as a bypass mode. In this way, at the slower operating speeds, the power draw of clock buffer 100 is mitigated because PLLs 124 and 144 can be turned off, or put in a low power state. For example, each PLL may draw up to 20 mW of power, and so, operating in the bypass mode may result in a power savings of up to 40 mW.

On the other hand, when the memory module is operating at transfer rates of 5600 Mbps or higher, the PLL mode output of clock state machine 110 can be provided to connect the output of input clock buffers 122 and 142 to respective PLLs 124 and 144, in what will be referred to as a single-PLL mode or a dual-PLL mode. The information handling systems into which memory modules are installed may provide different topologies for the differential signal pair clock inputs. In particular, an information handling system that is designed based upon one particular processor manufacturer's architecture may provide only a single differential signal pair clock input (for example DCK_A_t/c), while another information handling system that is designed based upon another particular processor manufacturer's architecture may provide two differential signal pair clock inputs (for example DCK_A_t/c and DCK_B_t/c).

For example, an information handling system that is designed based upon a first system-on-a-chip (SoC) manufacturer's architecture (e.g., an Intel-based architecture or the like) may provide a single differential signal pair clock input, and an information handling system that is designed based upon an AMD architecture may provide two differential signal pair clock inputs. When the information handling system is an Intel-based information handling system, the PLL mode signal from clock state machine 110 will be the single-PLL mode signal to connect the output of input clock buffer 122 to PLL 124. In this case, the treatment of the connection of the output of input clock buffer 142 to PLL 144 may be provided in an open state, as needed or desired. Additional logic may be provided to remove power from input clock buffer 142 and PLL 144, as needed or desired. In this way, only PLL 124 is operating, resulting in a power savings of up to 20 mW. On the other hand, when the information handling system is based upon another SoC manufacturer's architecture (e.g., an AMD-based architecture or the like), the PLL mode signal from clock state machine 110 may be the dual-PLL mode signal to connect the outputs of both of input clock buffer 122 and 142 to respective PLLs 124 and 144.

In the bypass mode, additional control signals (not illustrated) may be provided from clock state machine 110 to disable PLLs 124 and 144, thereby reducing the power drawn by clock buffer 100 as compared with the single-PLL mode and the dual-PLL mode, as needed or desired. Further, in the Single-PLL mode, the additional control signals may be provided from clock state machine 110 to disable PLL 144, thereby reducing the power drawn by clock buffer 100 as compared with the dual-PLL mode, as needed or desired.

The multiplexing of the various inputs of multiplexors 126, 128, 146, and 148 is provided by the multiplexor mode signal from clock state machine 110 based upon the information handling system and the utilized speed of the memory module into which clock buffer 100 is included. A particular embodiment of the switching modes for multiplexors 126, 128, 146, and 148 is provided in Table 1, bellow.

TABLE 1

Multiplexor Input Selection

| | Multiplexor Input Selected | | | |
|---|---|---|---|---|
| Multiplexor | Single-PLL f ≥ 5600 Mbps | Single-PLL f < 5600 Mbps (Bypass Mode) | Dual-PLL f ≥ 5600 Mbps | Dual-PLL f < 5600 Mbps (Bypass Mode) |
| MUX 0 | Input 0 | Input 1 | Input 0 | Input 1 |
| MUX 1 | Input 0 | Input 1 | Input 0 | Input 1 |
| MUX 2 | Input 0 | Input 1 | Input 2 | Input 3 |
| MUX 3 | Input 0 | Input 1 | Input 2 | Input 3 |

The memory devices in a particular memory module may be organized into one (1) or two (2) memory ranks. In this regard, clock buffer 100 provides individual differential signal pair clock outputs 1) for a first rank (Rank 0) of the first memory sub-channel (Sub-Channel A) (for example QCK0_A_t/c), 2) for a second rank (Rank 1) of the first memory sub-channel (Sub-Channel A) (for example QCK1_A_t/c), 3) for a first rank (Rank 0) of the second memory sub-channel (Sub-Channel B) (for example QCK0_B_t/c), and 4) for a second rank (Rank 1) of the second memory sub-channel (Sub-Channel B) (for example QCK1_B_t/c). If the memory module is a 1-rank memory module, only output clock buffers 130 and 150 need to be enabled by the output mode signal from clock state machine 110, and if the memory module is a 2-rank memory module, all of the output clock buffers 130, 132, 150, and 152 will be enabled by the output mode signal. In a particular example, an output clock buffer may draw around 15-17 mW, and so enabling Rank 0 but turning off the Rank 1 output clock buffers when the memory module is a 1-rank memory module results in an additional 30-34 mW power savings.

A clock buffer IC similar to clock buffer 100 may be provided with different topologies than the topology illustrated in FIG. 1. For example, the organization of the multiplexor inputs may differ from the illustrated organization, or the number of clock input buffer, and consequently the number of available clock inputs from the information handling system may vary, such as where four (4) input clock buffers are provided to facilitate backward compatibility with prior DDR memory topologies. Where such clock buffers differ from the illustrated embodiments, the methods and teachings of the current embodiments may be applicable to reduce the power levels in the clock buffer, as needed or desired.

Figure 2:
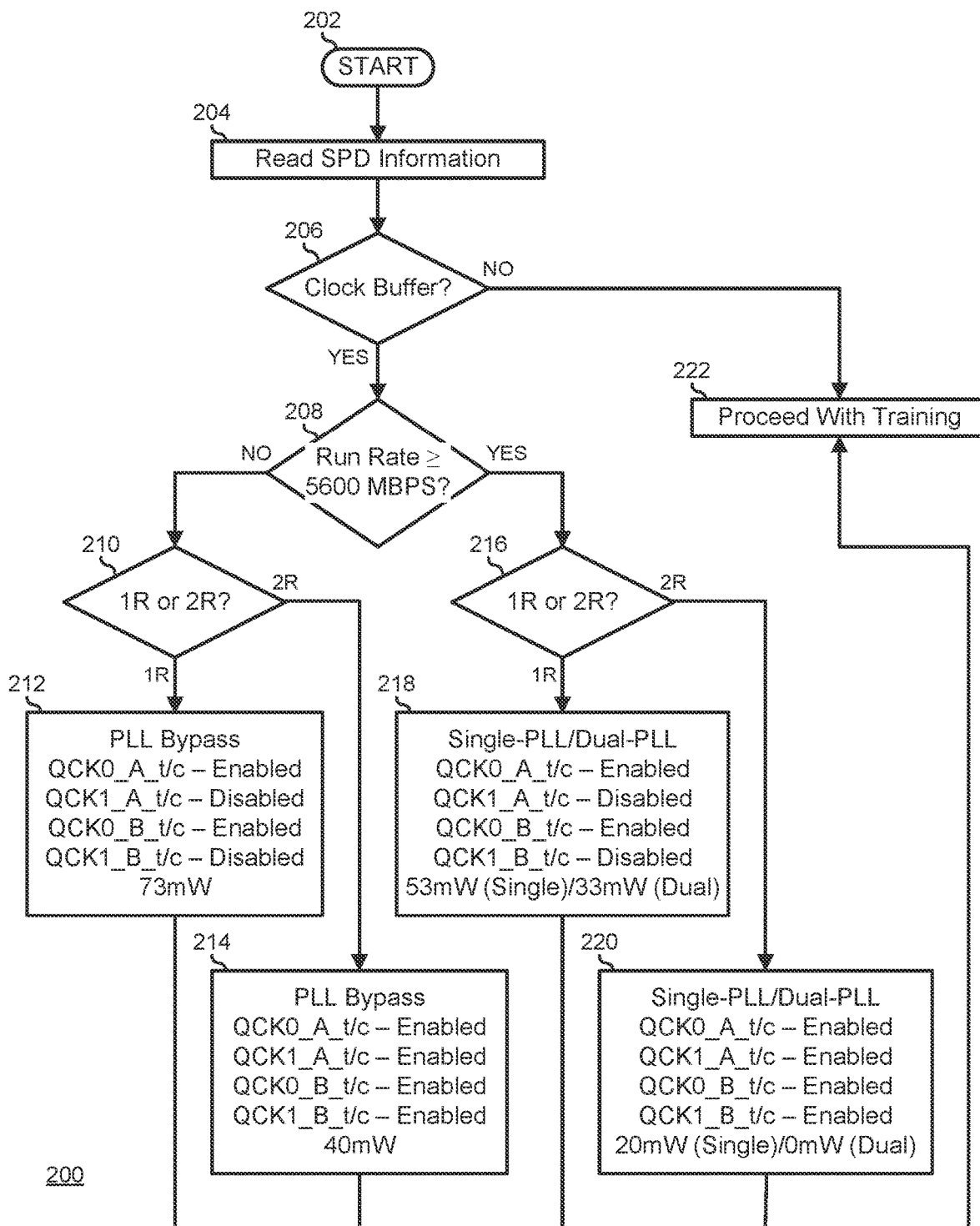
FIG. 2 is a flowchart illustrating a method for power reduction in memory modules according to an embodiment of the current disclosure.

FIG. 2 illustrates a method 200 for power reduction in memory modules, starting with block 202. A serial presence detect (SPD) device on a memory module is read in block 204. The SPD device can be read by an information handling system into which the memory module is installed as a step in the process of initializing the memory module as needed or desired. The SPD device can include information related to the configuration of the memory module, such as the data transfer speed supported by the memory module, whether or not the memory module includes a clock buffer device, whether the memory module is architected with one (1) rank or two (2) ranks of memory devices, and other information related to the initialization of the memory module. A decision is made as to whether or not the memory module includes a clock buffer device in decision block 206. If not, the "NO" branch of decision block 206 is taken, the memory initialization and training process is continued in block 222, and the method ends.

If the memory module includes a clock buffer device, the "YES" branch of decision block 206 is taken and a decision is made as to whether or not the data transfer speed setting for the memory module is 5600 Mbps or higher in decision block 208. If not, the "NO" branch of decision block 210 is taken, indicating that the clock buffer device is to be run in the Bypass Mode, and a decision is made as to whether or not the memory module is organized with one (1) rank or two (2) ranks of memory devices in decision block 210. In a further decision step of method 200, not illustrated, a decision can be made as to whether the information handling system is designed in accordance with a single-clock architecture or a dual-clock architecture, and internal multiplexors of the clock buffer device can be set to select the inputs accordingly, as described above. However, the setting of the multiplexor inputs may have less relevance to the power savings of the clock buffer device. Therefore, the current method is illustrated without such a decision step, and the method steps 212 and 214 as described below, will be the same, regardless of whether the information handling system is a single-clock architecture or a dual-clock architecture.

If the memory module is organized with one (1) rank of memory devices, the "1R" branch of decision block 210 is taken, and, in block 212, the first rank output clock buffers are enabled, providing differential signal pair clock outputs QCK0_A_t/c and QCK0_B_t/c, and the second rank output clock buffers are disabled, shutting down differential signal pair clock outputs QCK1_A_t/c and QCK1_B_t/c. In an exemplary case, around 73 mW power savings is achieved over a baseline configuration with all elements of the clock buffer device enabled. If the memory module is architected with two (2) ranks of memory devices, the "2R" branch of decision block 210 is taken, and, in block 214, all four output clock buffers are enabled, providing differential signal pair clock outputs QCK0_A_t/c, QCK1_A_t/c, QCK0_B_t/c, and QCK1_B_t/c. In an exemplary case, around 40 mW power savings is achieved over the baseline configuration.

Returning to decision block 208, if the data transfer speed setting for the memory module is 5600 Mbps or higher, the "YES" branch is taken, indicating that the clock buffer device is to be run in one of the PLL Modes (that is single-PLL mode and dual-PLL mode), and a decision is made as to whether or not the memory module is architected with one (1) rank or two (2) ranks of memory devices in decision block 216. As described above, in a further decision step of method 200, not illustrated, a decision can be made as to whether the information handling system is designed in accordance with a single-clock architecture or a dual-clock architecture, and internal multiplexors of the clock buffer device can be set to select the inputs accordingly, as described above. However, unlike the case described above, here, the setting of the multiplexor inputs will be relevant to the power savings. Thus, the current method is illustrated here with the power savings of both the single-PLL mode and the dual-PLL mode in the method steps 218 and 220 as described below.

If the memory module is architected with one (1) rank of memory devices, the "1R" branch of decision block 216 is taken, and, in block 218, the first rank output clock buffers are enabled, providing differential signal pair clock outputs QCK0_A_t/c and QCK0_B_t/c, and the second rank output clock buffers are disabled, shutting down differential signal pair clock outputs QCK1_A_t/c and QCK1_B_t/c. In an exemplary case in the single-PLL mode, around 53 mW power savings is achieved over the baseline configuration, and in the dual-PLL mode, around 33 mW power savings is achieved over the baseline configuration. If the memory module is architected with two (2) ranks of memory devices, the "2R" branch of decision block 216 is taken, and, in block 220, all four output clock buffers are enabled, providing differential signal pair clock outputs QCK0_A_t/c, QCK1_A_t/c, QCK0_B_t/c, and QCK1_B_t/c. In an exemplary case in the single-PLL mode, around 20 mW power savings is achieved over the baseline configuration, and in the dual-PLL mode, no power savings is achieved, this case being equivalent to the baseline configuration with both PLLs enabled and all four output clock buffers enabled. After all of blocks 212, 214, 218, and 220, the memory initialization and training process is continued in block 222, and the method ends.

Figure 3:
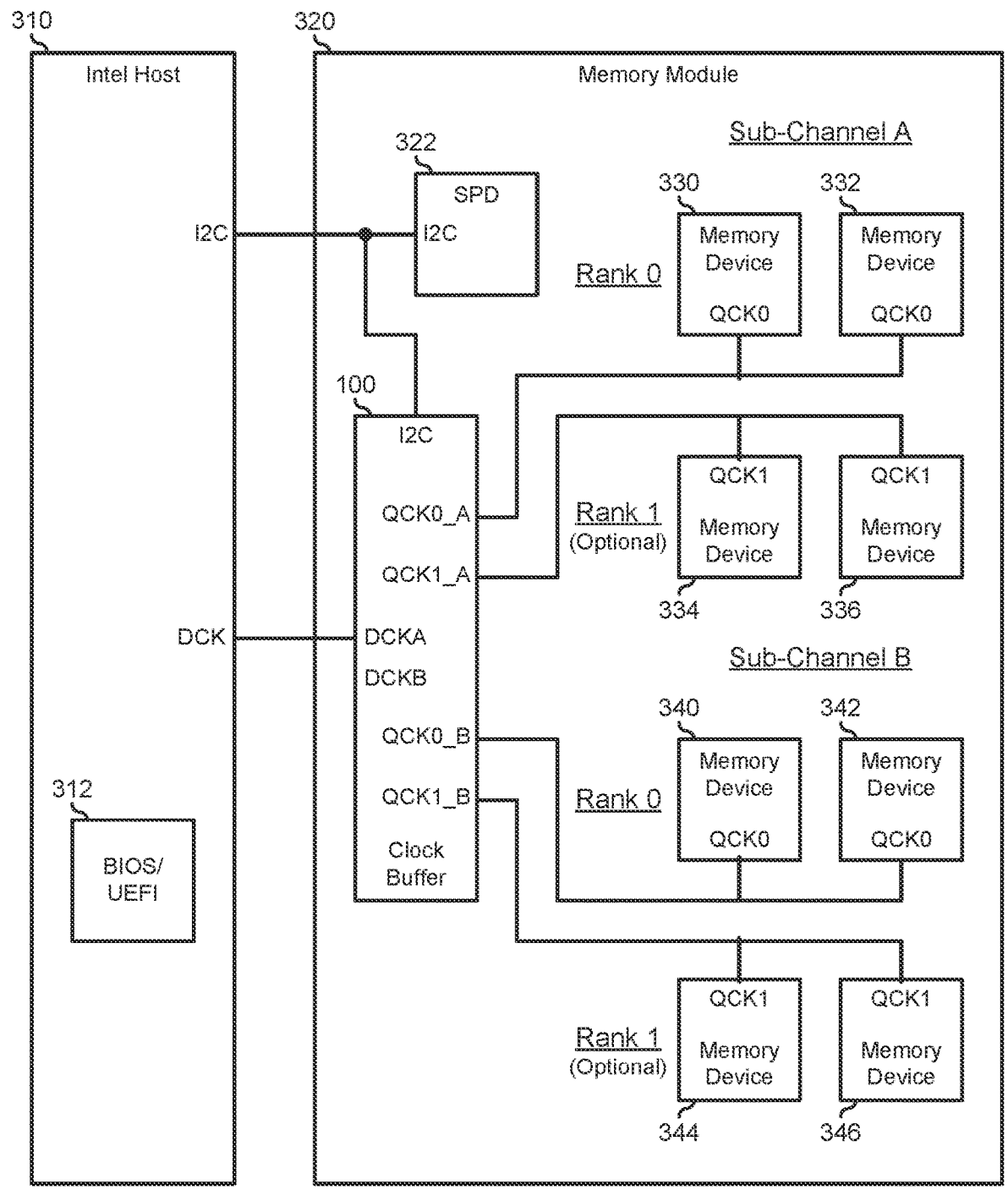
FIG. 3 is a block diagram of an information handling system according to an embodiment of the current disclosure.

FIG. 3 illustrates an information handling system 300 including a host processing system 310 and a memory module 320. Host processing system 310 represents the elements of information handling system 300 that are configured to provide the functions and features of the information handling system as needed or desired. In this regard, information handling system 300 may be similar to the information handling system described below.

Memory module 320 represents a DIMM, a UDIMM, a SoDIMM, a CAMM, or another memory module form factor, as needed or desired. Memory module 320 includes a clock buffer 100, an SPD device 322, and memory devices arranged in two memory sub-channels (sub-channel A and sub-channel B). In particular, a first rank (rank 0) of sub-channel A includes memory devices 330 and 332 that are clocked from the QCK0_A clock output of clock buffer 100, a second rank of sub-channel A includes memory devices 334 and 336 that are clocked from the QCK1_A clock output of the clock buffer, a first rank (rank 0) of sub-channel B includes memory devices 340 and 342 that are clocked from the QCK0 B clock output of the clock buffer, and a second rank of sub-channel B includes memory devices 344 and 346 that are clocked from the QCK1_B clock output of the clock buffer. A typical memory module may include more than two memory devices per rank, as needed or desired. Further, rank 1 of both sub-channel A and sub-channel B may be optional, as described above. Thus memory module 320 may not include memory devices 334, 336, 344, and 346, as needed or desired.

Host processing system 310 represents a processing system based upon an Intel architecture or the like. In particular host processing system 310 provides a single data clock output (DCK) to memory module 320. Host processing system 310 includes a basic input/output system (BIOS)/universal extensible firmware interface (UEFI) 312 that operates to initialize the elements of information handling system 300, including memory reference code that initializes and configures memory module 320. In particular, when information handling system 300 is powered on and enters a system power on self test (POST) phase, BIOS/UEFI 312 executes the memory reference code to read information related to the capabilities of memory module 320 from SPD device 322. The information includes an indication that memory module 320 includes clock buffer 100, whether the memory module is a 1-rank memory module or a 2-rank memory module, and whether the memory module is capable of operating with transfer rates of 5600 Mbps or higher. BIOS/UEFI 312 further operates to self-identify host processing system 310 as being an Intel-based host processing system, and that thus the host processing system is configured to provide a single clock (DCK) to clock buffer 100. Further, BIOS/UEFI 312 includes BIOS settings that identify a desired maximum data transfer speed to operate memory module 320.

BIOS/UEFI 312 may include code to implement a method similar to method 200 described above to determine a set of configuration settings for clock buffer 100 based upon the information described above. The method 200 may select for the single-PLL options where appropriate, based upon the fact that host processing system 310 is an Intel-based processing system. BIOS/UEFI 312 then operates to program clock buffer 100 based upon the set of configuration settings to optimize the power draw of memory module 320, as needed or desired. An information handling system similar to information handling system 300 may provide more than one (1) reference clock per memory module, as needed or desired. Such additional reference clocks may be optional, and that the teachings of the current embodiments are not limited to the case where only one (1) reference clock is provided.

Figure 4:
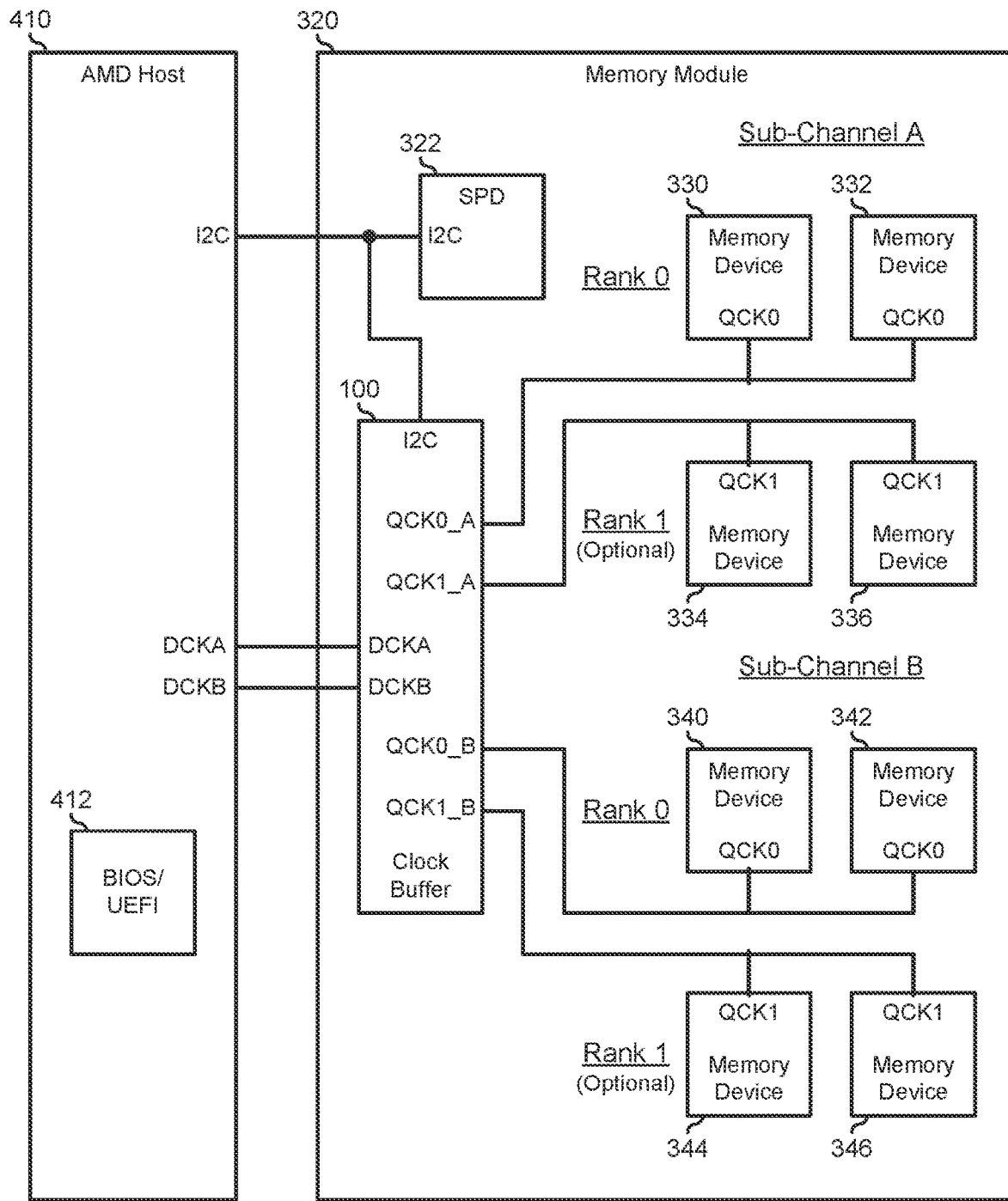
FIG. 4 is a block diagram of an information handling system according to another embodiment of the current disclosure.

FIG. 4 illustrates an information handling system 400 including a host processing system 410 and a memory module 320. Host processing system 410 represents the elements of information handling system 400 that are configured to provide the functions and features of the information handling system as needed or desired. In this regard, information handling system 400 may be similar to the information handling system described below.

Memory module 320 represents a DIMM, a UDIMM, a SoDIMM, a CAMM, or another memory module form factor, as needed or desired. Memory module 320 includes a clock buffer 100, an SPD device 322, and memory devices arranged in two memory sub-channels (sub-channel A and sub-channel B). In particular, a first rank (rank 0) of sub-channel A includes memory devices 330 and 332 that are clocked from the QCK0_A clock output of clock buffer 100, a second rank of sub-channel A includes memory devices 334 and 336 that are clocked from the QCK1_A clock output of the clock buffer, a first rank (rank 0) of sub-channel B includes memory devices 340 and 342 that are clocked from the QCK0_B clock output of the clock buffer, and a second rank of sub-channel B includes memory devices 344 and 346 that are clocked from the QCK1_B clock output of the clock buffer. A typical memory module may include more than two memory devices per rank, as needed or desired. Further, rank 1 of both sub-channel A and sub-channel B may be optional, as described above. Thus memory module 320 may not include memory devices 334, 336, 344, and 346, as needed or desired.

Host processing system 410 represents a processing system based upon an AMD architecture or the like. In particular host processing system 410 provides two data clock outputs (DCKA and DCKB) to memory module 320. Host processing system 410 includes a BIOS/UEFI 412 that operates to initialize the elements of information handling system 400, including memory reference code that initializes and configures memory module 320. In particular, when information handling system 400 is powered on and enters a system POST phase, BIOS/UEFI 412 executes the memory reference code to read information related to the capabilities of memory module 320 from SPD device 322. The information includes an indication that memory module 320 includes clock buffer 100, whether the memory module is a 1-rank memory module or a 2-rank memory module, and whether the memory module is capable of operating with transfer rates of 5600 Mbps or higher. BIOS/UEFI 412 further operates to self-identify host processing system 410 as being an AMD-based host processing system, and that thus the host processing system is configured to provide two clocks (DCKA and DCKB) to clock buffer 100. Further, BIOS/UEFI 412 includes BIOS settings that identify a desired maximum data transfer speed to operate memory module 320.

BIOS/UEFI 412 may include code to implement a method similar to method 200 described above to determine a set of configuration settings for clock buffer 100 based upon the information described above. Here, the method 200 may select for the dual-PLL options where appropriate, based upon the fact that host processing system 410 is an AMD-based processing system. BIOS/UEFI 412 then operates to program clock buffer 100 based upon the set of configuration settings to optimize the power draw of memory module 320, as needed or desired. An information handling system similar to information handling system 400 may provide more than two (2) reference clocks per memory module, as needed or desired. Such additional reference clocks may be optional, and that the teachings of the current embodiments are not limited to the case where only two (2) reference clocks are provided.

Figure 5:
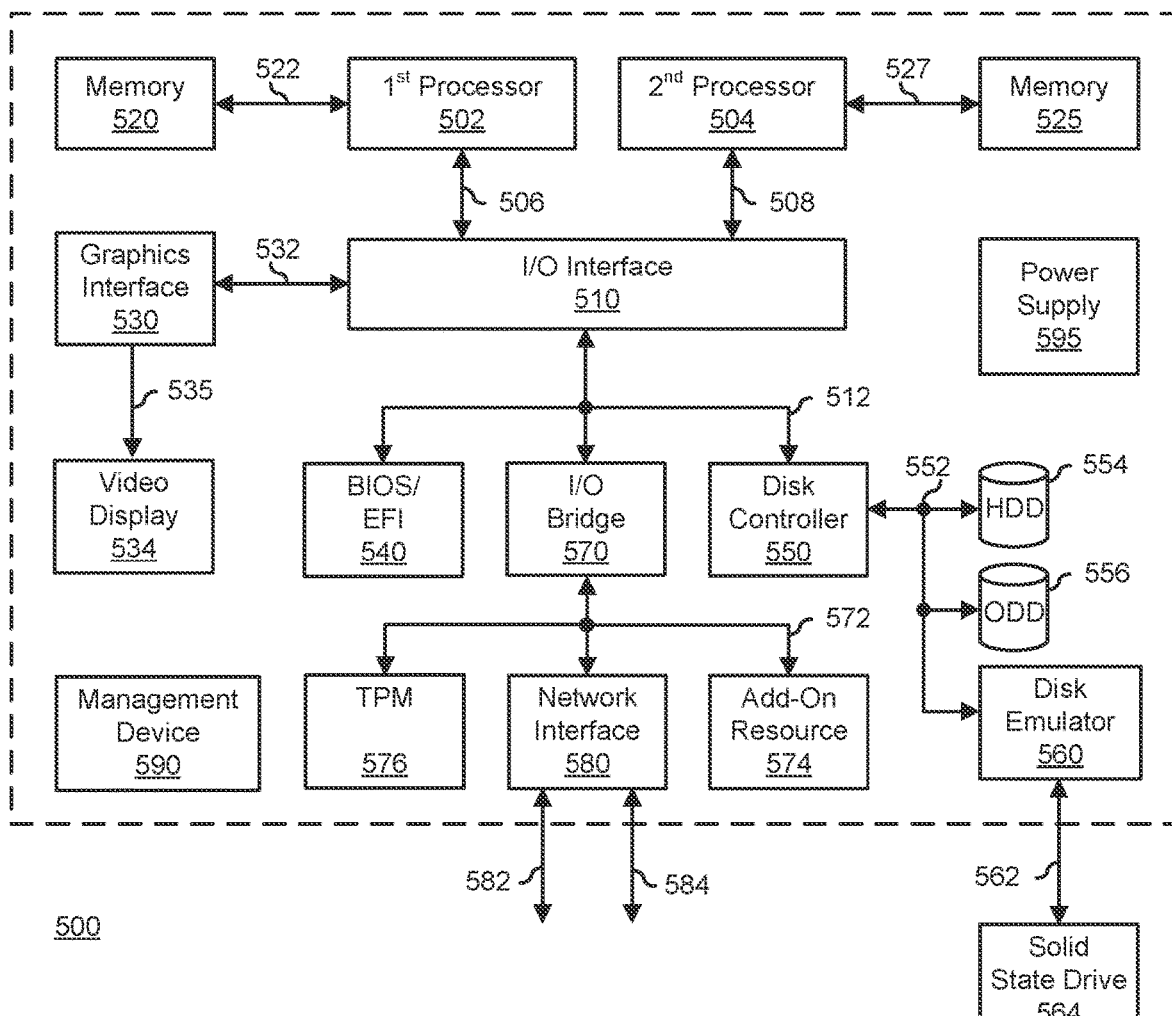
FIG. 5 is a block diagram illustrating a generalized information handling system according to another embodiment of the present disclosure.

FIG. 5 illustrates a generalized embodiment of an information handling system 500. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 500 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 500 can include processing resources for executing machine-executable code, such as a central processing unit (CPU), a programmable logic array (PLA), an embedded device such as a System-on-a-Chip (SoC), or other control logic hardware. Information handling system 500 can also include one or more computer-readable medium for storing machine-executable code, such as software or data. Additional components of information handling system 500 can include one or more storage devices that can store machine-executable code, one or more communications ports for communicating with external devices, and various input and output (I/O) devices, such as a keyboard, a mouse, and a video display. Information handling system 500 can also include one or more buses operable to transmit information between the various hardware components.

Information handling system 500 can include devices or modules that embody one or more of the devices or modules described below, and operates to perform one or more of the methods described below. Information handling system 500 includes processors 502 and 504, an input/output (I/O) interface 510, memories 520 and 525, a graphics interface 530, a basic input and output system/universal extensible firmware interface (BIOS/UEFI) module 540, a disk controller 550, a hard disk drive (HDD) 554, an optical disk drive (ODD) 556, a disk emulator 560 connected to an external solid state drive (SSD) 562, an I/O bridge 570, one or more add-on resources 574, a trusted platform module (TPM) 576, a network interface 580, a management device 590, and a power supply 595. Processors 502 and 504, I/O interface 510, memory 520 and 525, graphics interface 530, BIOS/UEFI module 540, disk controller 550, HDD 554, ODD 556, disk emulator 560, SSD 562, I/O bridge 570, add-on resources 574, TPM 576, and network interface 580 operate together to provide a host environment of information handling system 500 that operates to provide the data processing functionality of the information handling system. The host environment operates to execute machine-executable code, including platform BIOS/UEFI code, device firmware, operating system code, applications, programs, and the like, to perform the data processing tasks associated with information handling system 500.

In the host environment, processor 502 is connected to I/O interface 510 via processor interface 506, and processor 504 is connected to the I/O interface via processor interface 508. Memory 520 is connected to processor 502 via a memory interface 522. Memory 525 is connected to processor 504 via a memory interface 527. Graphics interface 530 is connected to I/O interface 510 via a graphics interface 532, and provides a video display output 535 to a video display 534. In a particular embodiment, information handling system 500 includes separate memories that are dedicated to each of processors 502 and 504 via separate memory interfaces. An example of memories 520 and 525 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 540, disk controller 550, and I/O bridge 570 are connected to I/O interface 510 via an I/O channel 512. An example of I/O channel 512 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 510 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 540 includes BIOS/UEFI code operable to detect resources within information handling system 500, to provide drivers for the resources, initialize the resources, and access the resources. BIOS/UEFI module 540 includes code that operates to detect resources within information handling system 500, to provide drivers for the resources, to initialize the resources, and to access the resources.

Disk controller 550 includes a disk interface 552 that connects the disk controller to HDD 554, to ODD 556, and to disk emulator 560. An example of disk interface 552 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 560 permits SSD 564 to be connected to information handling system 500 via an external interface 562. An example of external interface 562 includes a USB interface, an IEEE 1394 (Firewire) interface, a proprietary interface, or a combination thereof. Alternatively, solid-state drive 564 can be disposed within information handling system 500.

I/O bridge 570 includes a peripheral interface 572 that connects the I/O bridge to add-on resource 574, to TPM 576, and to network interface 580. Peripheral interface 572 can be the same type of interface as I/O channel 512, or can be a different type of interface. As such, I/O bridge 570 extends the capacity of I/O channel 512 when peripheral interface 572 and the I/O channel are of the same type, and the I/O bridge translates information from a format suitable to the I/O channel to a format suitable to the peripheral channel 572 when they are of a different type. Add-on resource 574 can include a data storage system, an additional graphics interface, a network interface card (NIC), a sound/video processing card, another add-on resource, or a combination thereof. Add-on resource 574 can be on a main circuit board, on a separate circuit board or add-in card disposed within information handling system 500, a device that is external to the information handling system, or a combination thereof.

Network interface 580 represents a NIC disposed within information handling system 500, on a main circuit board of the information handling system, integrated onto another component such as I/O interface 510, in another suitable location, or a combination thereof. Network interface device 580 includes network channels 582 and 584 that provide interfaces to devices that are external to information handling system 500. In a particular embodiment, network channels 582 and 584 are of a different type than peripheral channel 572 and network interface 580 translates information from a format suitable to the peripheral channel to a format suitable to external devices. An example of network channels 582 and 584 includes InfiniBand channels, Fibre Channel channels, Gigabit Ethernet channels, proprietary channel architectures, or a combination thereof. Network channels 582 and 584 can be connected to external network resources (not illustrated). The network resource can include another information handling system, a data storage system, another network, a grid management system, another suitable resource, or a combination thereof.

Management device 590 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 500. In particular, management device 590 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 500, such as system cooling fans and power supplies. Management device 590 can include a network connection to an external management system, and the management device can communicate with the management system to report status information for information handling system 500, to receive BIOS/UEFI or system firmware updates, or to perform other task for managing and controlling the operation of information handling system 500. Management device 590 can operate off of a separate power plane from the components of the host environment so that the management device receives power to manage information handling system 500 when the information handling system is otherwise shut down. An example of management device 590 includes a commercially available BMC product or other device that operates in accordance with an Intelligent Platform Management Initiative (IPMI) specification, a Web Services Management (WS-Man) interface, a Redfish Application Programming Interface (API), another Distributed Management Task Force (DMTF), or other management standard, and can include an Integrated Dell Remote Access Controller (iDRAC), an Embedded Controller (EC), or the like. Management device 590 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising:
   a host processing system including a first memory clock and a second memory clock; and
   a memory module including:
      a first rank of memory devices of a first sub-channel of memory devices;
      a first rank of memory devices of a second sub-channel of memory devices; and
      a clock buffer device including:
         a first clock input coupled to the first memory clock;
         a first phase-locked loop (PLL) selectably coupled to the first clock input;
         a second clock input coupled to the second memory clock; and
         a second PLL selectably coupled to the second clock input;
      wherein the clock buffer device is configured:
         in a first mode, to couple the first clock input via the first PLL to the first rank of memory devices of the first sub-channel and via the first PLL to the first rank of memory devices of the second sub-channel;
         in a second mode, to couple the first clock input directly to the first rank of memory devices of the first sub-channel and directly to the first rank of memory devices of the second sub-channel;
         in a third mode, to couple the first clock input via the first PLL to the first rank of memory devices of the first sub-channel and to couple the second clock input signal via the second PLL to the first rank of memory devices of the second sub-channel; and
         in a fourth mode, to couple the first clock input directly to the first rank of memory devices of the first sub-channel and to couple the second clock input directly to the first rank of memory devices of the second sub-channel.

2. The information handling system of claim 1, wherein the clock buffer device further includes:
   a first output clock buffer for the first rank of memory devices of the first sub-channel;
   a second output clock buffer for the first rank of memory devices of the second sub-channel;
   a third output clock buffer for a second rank of memory devices of the first sub-channel of memory devices; and
   a fourth output clock buffer for a second rank of memory devices of the second sub-channel.

3. The information handling system of claim 2, wherein the clock buffer device is further configured:
   to determine whether or not the memory module includes the second rank of memory devices of the first sub-channel and the second rank of memory devices of the second sub-channel;
   when the memory module includes the second rank of memory devices of the first sub-channel and the second rank of memory devices of the second sub-channel, to enable the first clock output buffer, the second clock output buffer, the third clock output buffer, and the fourth clock output buffer; and
   when the memory module does not include the second rank of memory devices of the first sub-channel and the second rank of memory devices of the second sub-channel, to enable the first clock output buffer and the second clock output buffer, and to disable the third clock output buffer and the fourth clock output buffer.

4. The information handling system of claim 1, wherein the memory module further includes:
   a second rank of memory devices of the first sub-channel; and
   a second rank of memory devices of the second sub-channel.

5. The information handling system of claim 4, wherein the clock buffer device is further configured:
   to determine that the memory module includes the second rank of memory devices of the first sub-channel and the second rank of memory devices of the second sub-channel;
   when the clock buffer device is in the first mode, to couple the first clock input via the first PLL to the second rank of memory devices of the first sub-channel and via the first PLL to the second rank of memory devices of the second sub-channel in response to determining that the memory module includes the second rank of memory devices of the first sub-channel and the second rank of memory devices of the second sub-channel;
   when the clock buffer device is in the second mode, to couple the first clock input directly to the second rank of memory devices of the first sub-channel and directly to the second rank of memory devices of the second sub-channel in response to determining that the memory module includes the second rank of memory devices of the first sub-channel and the second rank of memory devices of the second sub-channel;
   when the clock buffer device is in the third mode, to couple the first clock input via the first PLL to the second rank of memory devices of the first sub-channel and to couple the second clock input signal via the second PLL to the second rank of memory devices of the second sub-channel in response to determining that the memory module includes the second rank of memory devices of the first sub-channel and the second rank of memory devices of the second sub-channel; and
   when the clock buffer device is in the fourth mode, to couple the first clock input directly to the second rank of memory devices of the first sub-channel and to couple the second clock input directly to the second rank of memory devices of the second sub-channel in response to determining that the memory module includes the second rank of memory devices of the first sub-channel and the second rank of memory devices of the second sub-channel.

6. The information handling system of claim 1, wherein the clock buffer device enters one of the first mode, the second mode, the third mode, and the fourth mode based upon an indication from the host processing system.

7. The information handling system of claim 6, wherein the clock buffer device further includes a clock state machine configured to receive the indication.

8. The information handling system of claim 7, wherein the host processing system is coupled to the clock state machine via a two-wire interface to provide the indication to the clock buffer device.

9. The information handling system of claim 8, wherein the two-wire interface is an Inter-Integrated Circuit (I2C) interface.

10. A method, comprising:
    providing, on a host processing system of an information handling system, a first memory clock and a second memory clock;

providing, on a memory module, a first rank of memory devices of a first sub-channel of memory devices of the memory module;
providing, on the memory module, a first rank of memory devices of a second sub-channel of memory devices of the memory module;
providing, on a clock buffer device, a first clock input coupled to the first memory clock;
providing, on the clock buffer device, a first phase-locked loop (PLL) selectably coupled to the first clock input;
providing, on the clock buffer device, a second clock input coupled to the second memory clock;
providing, on the clock buffer device, a second PLL selectably coupled to the second clock input;
in a first mode, coupling the first clock input via the first PLL to the first rank of memory devices of the first sub-channel and via the first PLL to the first rank of memory devices of the second sub-channel;
in a second mode, coupling the first clock input directly to the first rank of memory devices of the first sub-channel and directly to the first rank of memory devices of the second sub-channel;
in a third mode, coupling the first clock input via the first PLL to the first rank of memory devices of the first sub-channel and coupling the second clock input signal via the second PLL to the first rank of memory devices of the second sub-channel; and
in a fourth mode, coupling the first clock input directly to the first rank of memory devices of the first sub-channel and coupling the second clock input directly to the first rank of memory devices of the second sub-channel.

11. The method of claim 10, further comprising:
providing, on the clock buffer device, a first output clock buffer for the first rank of memory devices of the first sub-channel;
providing, on the clock buffer device, a second output clock buffer for the first rank of memory devices of the second sub-channel;
providing, on the clock buffer device, a third output clock buffer for a second rank of memory devices of the first sub-channel of memory devices; and
providing, on the clock buffer device, a fourth output clock buffer for a second rank of memory devices of the second sub-channel.

12. The method of claim 11, further comprising:
determining whether or not the memory module includes the second rank of memory devices of the first sub-channel and the second rank of memory devices of the second sub-channel;
when the memory module includes the second rank of memory devices of the first sub-channel and the second rank of memory devices of the second sub-channel, enabling the first clock output buffer, the second clock output buffer, the third clock output buffer, and the fourth clock output buffer; and
when the memory module does not include the second rank of memory devices of the first sub-channel and the second rank of memory devices of the second sub-channel, enabling the first clock output buffer and the second clock output buffer, and disabling the third clock output buffer and the fourth clock output buffer.

13. The method of claim 10, further comprising:
providing, on the memory module, a second rank of memory devices of the first sub-channel; and
providing, on the memory module, a second rank of memory devices of the second sub-channel.

14. The method of claim 13, further comprising:
determining that the memory module includes the second rank of memory devices of the first sub-channel and the second rank of memory devices of the second sub-channel;
when the clock buffer device is in the first mode, coupling the first clock input via the first PLL to the second rank of memory devices of the first sub-channel and via the first PLL to the second rank of memory devices of the second sub-channel in response to determining that the memory module includes the second rank of memory devices of the first sub-channel and the second rank of memory devices of the second sub-channel; and
when the clock buffer device is in the second mode, coupling the first clock input directly to the second rank of memory devices of the first sub-channel and directly to the second rank of memory devices of the second sub-channel in response to determining that the memory module includes the second rank of memory devices of the first sub-channel and the second rank of memory devices of the second sub-channel;
when the clock buffer device is in the third mode, coupling the first clock input via the first PLL to the second rank of memory devices of the first sub-channel and coupling the second clock input signal via the second PLL to the second rank of memory devices of the second sub-channel in response to determining that the memory module includes the second rank of memory devices of the first sub-channel and the second rank of memory devices of the second sub-channel; and
when the clock buffer device is in the fourth mode, coupling the first clock input directly to the second rank of memory devices of the first sub-channel and coupling the second clock input directly to the second rank of memory devices of the second sub-channel in response to determining that the memory module includes the second rank of memory devices of the first sub-channel and the second rank of memory devices of the second sub-channel.

15. The method of claim 10, further comprising:
receiving, by the clock buffer device, an indication from the host processing system; and
entering one of the first mode, the second mode, the third mode, and the fourth mode based upon the indication.

16. The method of claim 15, further comprising providing, on the clock buffer device, a clock state machine configured to receive the indication.

17. The method of claim 16, further comprising coupling the host processing system to the clock state machine via a two-wire interface to provide the indication to the clock buffer device.

18. The method of claim 17, wherein the two-wire interface is an inter-integrated circuit interface.

19. An information handling system, comprising:
a host processing system including a first memory clock and a second memory clock; and
a memory module including:
 a first rank of memory devices of a first sub-channel of memory devices;
 a first rank of memory devices of a second sub-channel of memory devices; and
 a clock buffer device including:
  a first clock input coupled to the first memory clock;
  a first phase-locked loop (PLL) selectably coupled to the first clock input;
  a second clock input coupled to the second memory clock; and a second PLL selectably coupled to the second clock input;

wherein the clock buffer device is configured:

in a first mode, to couple the first clock input directly to the first rank of memory devices of the first sub-channel and directly to the first rank of memory devices of the second sub-channel; and in a second mode, to couple the first clock input directly to the first rank of memory devices of the first sub-channel and directly to the first rank of memory devices of the second sub-channel;

in a third mode, to couple the first clock input via the first PLL to the first rank of memory devices of the first sub-channel and to couple the second clock input signal via the second PLL to the first rank of memory devices of the second sub-channel; and in a fourth mode, to couple the first clock input directly to the first rank of memory devices of the first sub-channel and to couple the second clock input directly to the first rank of memory devices of the second sub-channel; and wherein a basic input/output system of the host processing system provides an indication to configure the clock buffer device in one of the first mode and the second mode.

20. The information handling system of claim 19, wherein the clock buffer device further includes:

a first output clock buffer for the first rank of memory devices of the first sub-channel;

a second output clock buffer for the first rank of memory devices of the second sub-channel;

a third output clock buffer for a second rank of memory devices of the first sub-channel of memory devices; and a fourth output clock buffer for a second rank of memory devices of the second sub-channel.

* * * * *